United States Patent
Kato et al.

(10) Patent No.: US 10,209,310 B2
(45) Date of Patent: Feb. 19, 2019

(54) ROTARY MACHINE DIAGNOSTIC SYSTEM

(71) Applicant: Hitachi, Ltd., Chiyoda-ku, Tokyo (JP)

(72) Inventors: Tetsuji Kato, Tokyo (JP); Kohji Maki, Tokyo (JP); Minori Nagata, Tokyo (JP)

(73) Assignee: Hitachi, Ltd., Tokyo (JP)

(*) Notice: Subject to any disclaimer, the term of this patent is extended or adjusted under 35 U.S.C. 154(b) by 142 days.

(21) Appl. No.: 15/266,648

(22) Filed: Sep. 15, 2016

(65) Prior Publication Data

US 2017/0089983 A1  Mar. 30, 2017

(30) Foreign Application Priority Data

Sep. 25, 2015 (JP) ................. 2015-187570

(51) Int. Cl.
- *G01R 31/34* (2006.01)
- *G01R 31/02* (2006.01)
- *G06N 3/12* (2006.01)

(52) U.S. Cl.
CPC .......... *G01R 31/34* (2013.01); *G01R 31/025* (2013.01); *G01R 31/343* (2013.01); *G06N 3/126* (2013.01)

(58) Field of Classification Search
CPC .................................... G01R 31/34
USPC .............................................. 702/58
See application file for complete search history.

(56) References Cited

U.S. PATENT DOCUMENTS

| | | | | |
|---|---|---|---|---|
| 5,748,459 A * | 5/1998 | Yamada | .............. | H02M 7/00 318/490 |
| 6,199,023 B1 * | 3/2001 | Kliman | .............. | G01R 31/343 318/490 |
| 2012/0038303 A1 * | 2/2012 | Villwock | .............. | G01R 31/34 318/400.33 |
| 2013/0096865 A1 * | 4/2013 | Gao | .............. | G01R 31/34 702/108 |
| 2014/0084937 A1 | 3/2014 | Neti et al. | | |

(Continued)

FOREIGN PATENT DOCUMENTS

| | | |
|---|---|---|
| JP | 2004-150844 A | 5/2004 |
| JP | 2008-164375 A | 7/2008 |
| KR | 10-2008-0032761 A | 4/2008 |

OTHER PUBLICATIONS

Extended European Office Action issued in counterpart European Application No. 16190297.8 dated Jan. 26, 2017 (9 pages).

(Continued)

*Primary Examiner* — Ricky Ngon
(74) *Attorney, Agent, or Firm* — Crowell & Moring LLP

(57) ABSTRACT

A rotary machine diagnostic system includes: a current measurement unit for measuring a leakage current of a rotary machine; a voltage measurement unit for measuring a voltage of the rotary machine corresponding to the flowing leakage current; and a data processing unit. The data processing unit has a function of performing transient response analysis on a predetermined equivalent circuit model, which is equivalent to a leakage current path of the rotary machine, using current data and voltage data having a predetermined time width which are respectively measured at predetermined time intervals by the current measurement unit and the voltage measurement unit, and a function of extracting parameters of the equivalent circuit of the leakage current path.

12 Claims, 6 Drawing Sheets

(56) References Cited

U.S. PATENT DOCUMENTS

2014/0163912 A1* 6/2014 Gao .................. G01R 31/34
702/65

OTHER PUBLICATIONS

Lee et al., "An On-Line Technique for Monitoring the Insulation Condition of AC Machine Stator Windings", IEEE, 2015, pp. 286-294, XP010854454.

P. Zhang et al., "A Novel Online Stator Ground-Wall Insulation Monitoring Scheme for Inverter-Fed AC Motors," IEEE Transactions on Industry Applications, May/Jun. 2015, pp. 2201-2207, vol. 51, No. 3.

* cited by examiner

ROTARY MACHINE DIAGNOSTIC SYSTEM

CROSS-REFERENCE TO RELATED APPLICATION

This application is based upon and claims priority from the Japanese Patent Application No. 2015-187570, filed on Sep. 25, 2015, the entire contents of which are incorporated herein by reference.

BACKGROUND OF THE INVENTION

1. Field of the Invention

The present invention relates to a rotary machine diagnostic system.

2. Description of the Related Art

In a case where an unexpected failure occurs with a rotary machine such as a motor (electric motor) or a generator assembled into a production facility, it is necessary to perform unplanned repair work or unplanned replacement work on the rotary machine such that the rate of operation of the production facility is decreased, or it is necessary to revise a production plan.

A deteriorated state may be ascertained by stopping the motor at a suitable timing and performing a diagnosis for the motor offline so as to forestall an unexpected failure, and as a result, it is possible to prevent an unexpected failure to some extent. However, it is necessary to stop the rotary machine for offline diagnosis, thereby causing a decrease in the rate of operation of the production facility.

From the above background, there are increasing demands for online diagnosis by which a rotary machine can be diagnosed during operation. Online diagnosis also allows a system to detect symptoms of the rotary machine which are obvious only during rotation.

For example, one of causes of an unexpected failure is insulation damage to a rotary machine. An example of the related art regarding insulation damage to a rotary machine is disclosed in Non Patent Literature (NPL) 1: P. Zhang, K. Younsi and P. Neti: "A Novel Online Stator Ground-Wall Insulation Monitoring Scheme for Inverter-Fed AC Motors", IEEE Transactions on Industry Applications Vol. 51 No. 3 (2015) pp. 2201-2207.

As a diagnosis technique for a rotary machine, NPL 1 discloses a method of calculating a parameter of a leakage current path equivalent circuit from a current equivalent to a leakage current and the phase difference and the amplitude ratio of a voltage applied to a motor via fast Fourier transform (FFT).

However, the method disclosed in NPL 1 has the following problems.

According to the FFT technology disclosed in NPL 1, current and voltage waveforms are required to be in a static state in order to allow accurate extraction of equivalent circuit parameters. In contrast, in a motor that is actually being used, a rotational speed may change or a load connected to the motor may change, and thus, the current or voltage of the motor may change. In a case where a signal having a frequency component used to extract a capacitance is small compared to the noise, there occurs a problem that a capacitance extraction error becomes increased. If the capacitance extraction error is large, in a case where a voltage applied to the rotary machine changes transiently due to change in a load or the like driven by the motor, there occurs a problem that it becomes difficult to accurately calculate a parameter of a leakage current path equivalent circuit.

SUMMARY OF THE INVENTION

The present invention is made in light of these problems, and an object of the present invention is to provide a rotary machine diagnostic system that diagnoses a deteriorated condition of a rotary machine by accurately calculating a parameter of a leakage current path equivalent circuit even if a voltage applied to the rotary machine changes transiently.

In order to solve these problems and to achieve the object of the present invention, the present invention has the following configuration.

That is, a rotary machine diagnostic system includes: current measurement means for measuring a leakage current of a rotary machine; voltage measurement means for measuring a voltage of the rotary machine corresponding to the flowing leakage current; and data processing means. The data processing means has a function of performing transient response analysis on a predetermined equivalent circuit model, which is equivalent to a leakage current path of the rotary machine, using current data and voltage data having a predetermined time width which are respectively measured at predetermined time intervals by the current measurement means and the voltage measurement means, and a function of extracting parameters of the leakage current path equivalent circuit.

Other means will be described in embodiments.

According to the present invention, it is possible to provide a rotary machine diagnostic system that diagnoses a deteriorated condition of a rotary machine by accurately calculating a parameter of a leakage current path equivalent circuit even if a voltage changes transiently.

BRIEF DESCRIPTION OF THE DRAWINGS

FIGS. 1A and 1B are diagrams illustrating an example configuration of a rotary machine diagnostic system in a first embodiment of the present invention, in which FIG. 1A illustrates an example of the connection configuration of a rotary machine, and FIG. 1B illustrates a leakage current path of the rotary machine.

FIGS. 8A and 8B are graphs illustrating examples comparing the accuracy in extracting the capacitance and the resistance of a leakage current path based on a transient response analysis technique in the present invention with that based on a fast Fourier transform technique in the related art, in which FIG. 8A illustrates change over time in capacitance, and FIG. 8B illustrates change over time in resistance.

DETAILED DESCRIPTION OF THE PREFERRED EMBODIMENTS

Hereinafter, forms (hereinafter, referred to as "embodiments") in which the present invention is realized will be suitably described with reference to the accompanying drawings.

«First Embodiment»

A rotary machine diagnostic system in a first embodiment of the present invention will be described with reference to FIGS. 1A to 5.

<Configuration of System>

Figure 1A:
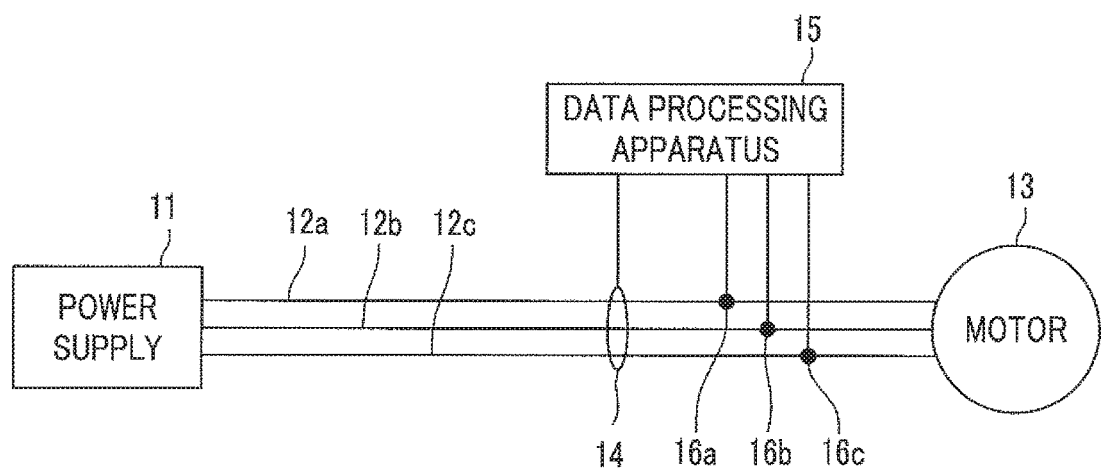
Figure 1B:
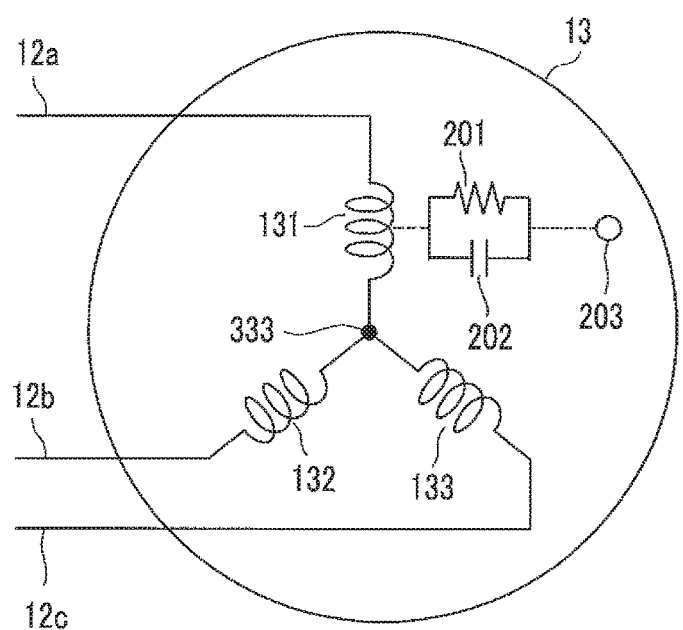

FIGS. 1A and 1B are diagrams illustrating an example configuration of the rotary machine diagnostic system in the first embodiment of the present invention, in which FIG. 1A illustrates an example of the connection configuration of a rotary machine, and FIG. 1B illustrates a leakage current path of the rotary machine.

In FIG. 1A, three-phase alternating current power (a U phase, a V phase, and a W phase) is supplied from a power supply 11 to a three-phase motor (electric motor) 13 via power supply lines 12a, 12b, and 12c.

A current sensor (current measurement means) 14 and voltage sensors (voltage measurement means) 16a, 16b, and 16c are provided on the power supply lines 12a, 12b, and 12c, and respectively measure a zero-phase current and a three-phase phase voltage. Measurement data is input to a data processing apparatus (data processing means) 15.

In this configuration, the current sensor 14 is disposed in such a way as to surround the power supply lines 12a, 12b, and 12c. That is, as described above, when the zero-phase current of the three-phase power supply lines 12a, 12b, and 12c is measured, in a case where a leakage current increases due to deterioration of an insulation layer inside the motor 13, a larger current flows through the current sensor 14.

The type of the current sensor 14 is not limited to a specific type. It is possible to use a through hole current sensor, a clamp type current sensor, a split core current sensor, a fiber optic current sensor utilizing a magneto-optical effect, or the like.

The voltage sensors 16a, 16b, and 16c are, for example, voltage probes. The voltage sensors 16a, 16b, and 16c detect the voltages (electric potentials) of the respective three-phase power supply lines 12a, 12b, and 12c, convert the detected voltages to low voltages, and transmit the low voltages to the data processing apparatus 15. The data processing apparatus 15 detects a line voltage (or a phase voltage) between the three-phase power supply lines 12a, 12b, and 12c based on signals from the voltage sensors 16a, 16b, and 16c.

The data processing apparatus 15 executes computations such as extracting a parameter of a leakage current path equivalent circuit of the rotary machine. The computations to be executed will be described in detail later.

In FIG. 1B, the motor 13 includes stator coils 131, 132, and 133 which are Y-connected to each other. One end of each of the stator coils 131, 132, and 133 is connected to a neutral point 333. The other ends of the stator coils 131, 132, and 133 are connected to the respective three-phase power supply lines 12a, 12b, and 12c, and three-phase power is supplied to the stator coils 131, 132, and 133.

The data processing apparatus 15 may detect a line voltage (or a phase voltage) between the three-phase power supply lines 12a, 12b, and 12c, and the voltage of the neutral point 333 based on signals from the voltage sensors 16a, 16b, and 16c.

A rotor of the motor is not illustrated.

In this application, the embodiment is applied to a motor (electric motor), and similarly, can be applied to a generator. For this reason, a motor (electric motor) in this application may be referred to as a rotary machine which is a generic term for an electric motor and a generator.

<Example of Leakage Current Path Equivalent Circuit>

In FIG. 1B, a parallel circuit of a resistor 201 and a capacitor 202 is an example of a leakage current path equivalent circuit in a case where an insulation layer of the motor 13 deteriorates.

In FIG. 1B, a leakage path, which is the parallel circuit of the resistor 201 and the capacitor 202, is considered to be formed between the stator coil 131 and a leakage place 203 which becomes a current path when deterioration occurs in the motor 13.

The parallel circuit of the resistor 201 and the capacitor 202 will be described in detail later.

A leakage current path equivalent circuit is not limited to the parallel circuit of the resistor 201 and the capacitor 202.

The leakage place 203 which has become a leakage path is not limited to a specific place. The leakage place 203 may be any place inside the motor 13 or other outside places.

The leakage place 203 is not limited to a predetermined point, and may be a region or range having a predetermined area.

<Diagnosis Flow of Rotary Machine Diagnostic System>

Hereinafter, the diagnosis flow of the rotary machine diagnostic system will be described.

Figure 2:
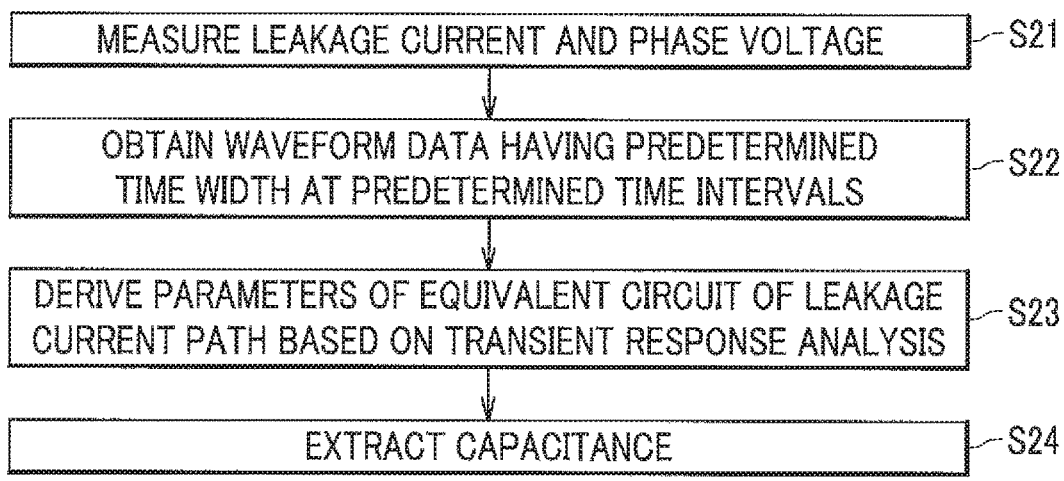
FIG. 2 is a flowchart illustrating an example diagnosis flow of the rotary machine diagnostic system in the first embodiment of the present invention.

FIG. 2 is a flowchart illustrating an example diagnosis flow of the rotary machine diagnostic system in the first embodiment of the present invention. The diagnosis flow of the rotary machine diagnostic system is executed by the current measurement means (the current sensor 14: FIG. 1A), the voltage measurement means (the voltage sensors 16a, 16b, and 16c), and the data processing means (the data processing apparatus 15: FIG. 1A).

«Step S21»

Step S21 in FIG. 2 is a step in which a leakage current and a phase voltage are measured.

As described above, a zero-phase current is measured by the current sensor 14 (FIG. 1A), and a phase voltage is measured by the voltage sensors 16a, 16b, and 16c (FIG. 1A). Measurement data is input to and stored in the data processing apparatus 15 (FIG. 1A).

«Step S22»

In Step S22, waveform data items having a predetermined time width are acquired by cutting the measured zero-phase current data and phase voltage data at predetermined time intervals according to a model to be described later.

The sum of the zero-phase current acquired by the current sensor 14 (FIG. 1A) and a three-phase voltage acquired from phase (three phase) voltages acquired by the voltage sensors 16a, 16b, and 16c is used to derive a parameter of a leakage current path equivalent circuit to be described later.

«Step S23»

In Step S23, a parameter of a leakage current path equivalent circuit is derived via a transient response analysis technique (function).

The transient response analysis technique (function) will be described later.

«Step S24»

A capacitance is extracted by deriving the parameter of the leakage current path equivalent circuit in Step S23 (the data processing apparatus 15: FIG. 1A).

The reason for this is that there is a relationship between change in the capacitance and degradation of an insulation layer which will be described later.

In a case where the capacitance exceeds a predetermined threshold value range, information indicating that the threshold value range has been exceeded may be transmitted to related apparatuses by the data processing means (the data processing apparatus 15). In this case, the data processing means (the data processing apparatus 15) also serves as information transmission means by which the information indicating that the threshold value range has been exceeded is transmitted to related apparatuses.

<Transient Response Analysis>

Hereinafter, transient response analysis will be described with reference to an example.

"Transient response analysis" is also referred to as time history response analysis, and is a technique of analyzing a motion changing over time. Transient response analysis is analysis for determining what response is made to inputs changing over time. In a case where inputs are not periodic and are sporadic, the transient response analysis technique is used.

An example in which a parameter of a leakage current path equivalent circuit is derived via transient response analysis will be described with reference to FIGS. 3 to 5.

Figure 3:
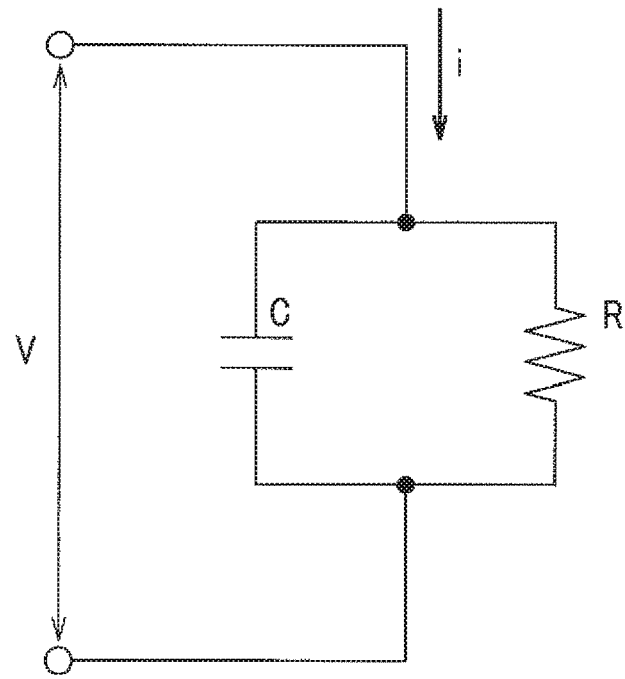
FIG. 3 is a diagram that models a leakage current path by connecting a resistor R in parallel with a capacitor C.

FIG. 3 is a diagram modeling a leakage current path which is a parallel connection (parallel circuit) of a resistor R and a capacitor C.

In the circuit configuration of an equivalent circuit, arbitrary numbers of resistors, inductors (inductive reactors), or capacitors (capacitive reactors) may be used. In contrast, the leakage current path model illustrated in FIG. 3 will be described as a simple example model.

In the parallel connection circuit of the resistor R and the capacitor C illustrated in FIG. 3, a current component flowing through the resistor R is (v/R) and a current component flowing through the capacitor C is (C−dv/dt) where v is voltage, i is current, and t is time. Expression 1 is established by aggregating these variables.

$$i = \frac{v}{R} + C\frac{dv}{dt} \quad \text{(Expression 1)}$$

Figure 4:
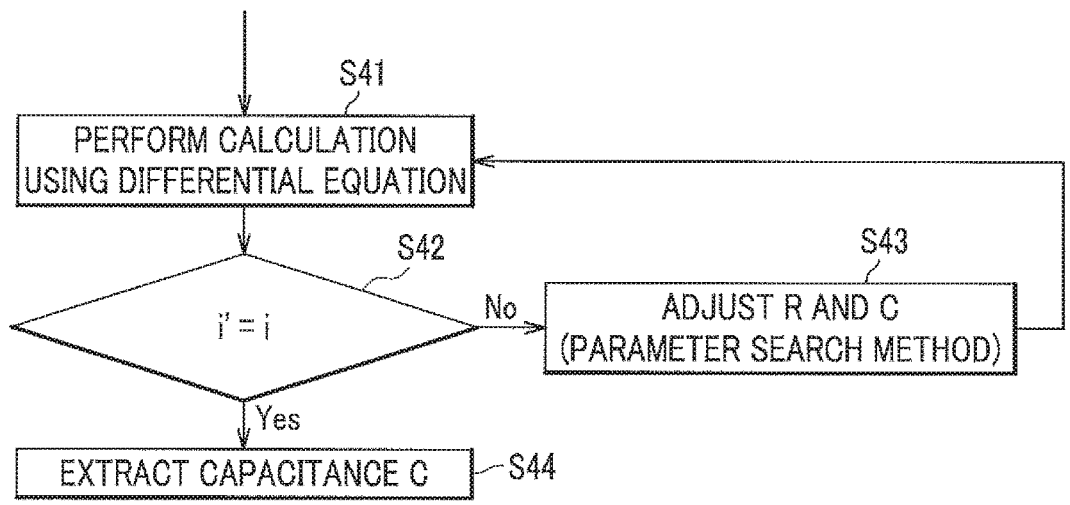
FIG. 4 is a flowchart illustrating an example of a transient response analysis method in the current path model illustrated in FIG. 3.

FIG. 4 is a flowchart illustrating an example of a transient response analysis method in the current path model illustrated in FIG. 3.

In FIG. 4, in Step S41 which will be described later, a differential equation is calculated, and in a case where the equivalent circuit in FIG. 3 is modeled as described above, Expression 1 is established.

Accordingly, a temporary current i' in the calculation process is represented by Expression 2 which is a differential equation.

R and C in Expression 2 are respectively equivalent to R and C of the parallel circuit in FIG. 3, and are numerical values which are not determined in the calculation process as described later.

$$i' = \frac{v}{R} + C\frac{dv}{dt} \quad \text{(Expression 2)}$$

Hereinafter, a method of calculating R and C in Steps S41 to S44 of FIG. 4 will be described.

«Step S41»

First, the current i' is calculated from Expression 2 using the voltage v obtained from measurements and the equivalent circuit model assumed in FIG. 3.

Initially, the current i' is calculated from Expression 2 using the equivalent circuit parameters R and C temporarily determined. In a case where Step S43 (to be described later) is executed, the current i' is calculated from Expression 2 using the equivalent circuit parameters R and C obtained in Step S43.

«Step S42»

In Step S42, the current i' obtained from Expression 2 is compared with the measured value of the current i.

In a case where, as a result of comparison of the current i' calculated from Expression 2 with the measured value of the current i, a difference therebetween is within a predetermined allowable error range, and i' is considered to be the same as i (Yes), the process proceeds to Step S44. In a case where the error is large (No), the process proceeds to Step S43.

A method of determining whether the relationship of i'=i is satisfied is not limited to the aforementioned method. For example, it is possible to determine the absolute value of a difference between the value i at each measurement point and the value of i' at a point corresponding to each measurement point, based on the criteria of whether the sum of the values at the measurement points is less than a predetermined threshold value.

«Step S43»

In Step S43, the values of the equivalent circuit parameters R and C are adjusted via a parameter search technique. The process returns to Step S41, the calculation of Expression 2 is repeated again using the adjusted R and C.

The values of the equivalent circuit parameters R and C can be found (searched for) by repeating Steps S41, S42, and S43 until the value of the current i' calculated from Expression 2 coincides with the measured value of the current i within the allowable error range.

An operation of finding the values of the equivalent circuit parameters R and C by repeating the aforementioned calculation until the current i' coincides with the current i within the allowable error range is suitably referred to as fitting.

As a parameter search technique, there are a genetic algorithm, a linear search method, a Newton method which is a type of linear search method, and the like. The genetic algorithm will be described later.

«Step S44»

In Step S44, the final value of the equivalent circuit parameter C calculated from Expression 2 is extracted as the value of the capacitor C.

This approach is based on the determination that, in a case where the measured value of the current i coincides with the value of the current i' calculated from Expression 2 within the allowable error range, the final value of the equivalent circuit parameter C calculated from Expression 2 is substantially the same as the value of the capacitor C of the leakage current path caused by deterioration of an insulation layer.

After extraction of the value of the capacitor C is ended, information which contains the extracted capacitance as an equivalent circuit parameter regarding the symptoms of deterioration of the rotary machine is transmitted to related apparatuses or a user (a person in charge or an operator) who deals with the information.

Execution of Steps S21 to S24 of FIG. 2 by the current measurement means 14, the voltage measurement means 16a, 16b, and 16c, and data processing means 15 illustrated in FIG. 1A is an example of equivalent circuit parameter extraction means (extraction means).

<Genetic Algorithm>

As described above, in Step S43 of FIG. 4, R and C are adjusted via a parameter search technique. As a parameter search technique, there are a genetic algorithm, a linear search method, a Newton method which is a type of linear search method, and the like.

Hereinafter, a method of applying a genetic algorithm, which is an example of a parameter search method, to the adjustment of R and C, will be described.

Figure 5:
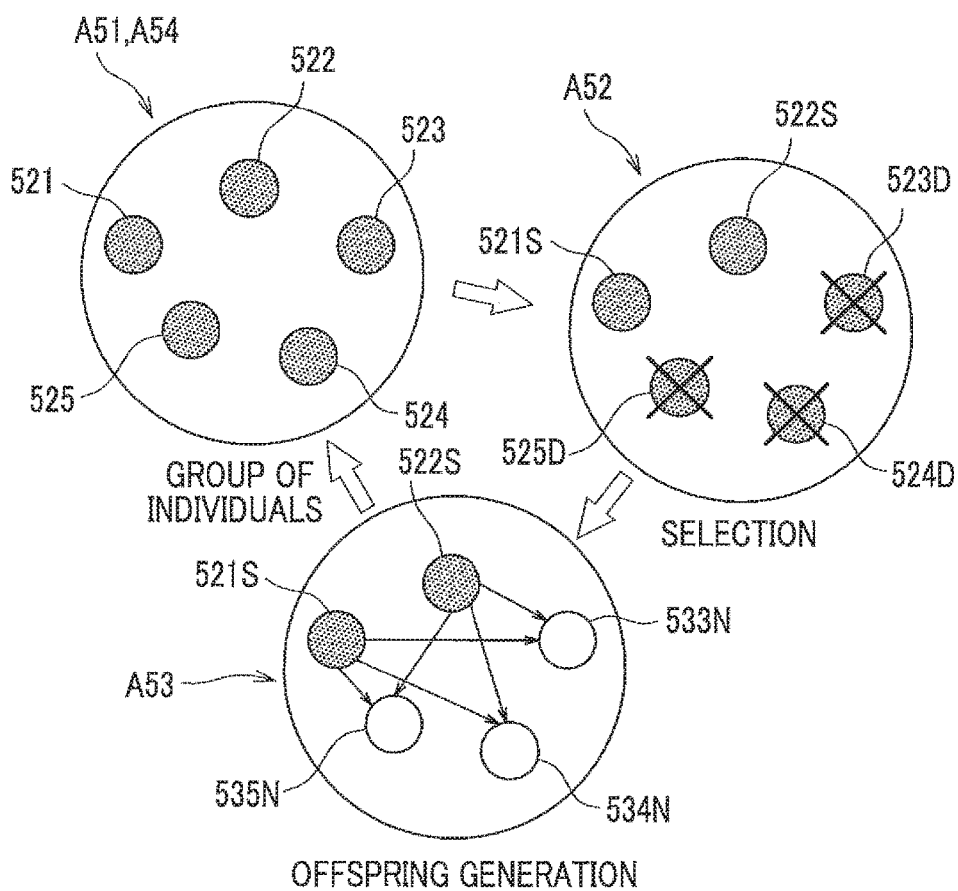
FIG. 5 is a view illustrating the concept of a genetic algorithm.

FIG. 5 is a view illustrating the concept of the genetic algorithm. In the following description, a "set" which is a combination of R and C, is properly referred to as an "individual" which is a general term used in a genetic algorithm.

«Algorithm A51»

First, N (five in FIG. 5: 521 to 525) sets (individuals) which are combinations of the equivalent circuit parameters R and C are randomly generated. A group of individuals (sets 521 to 525) which is N sets (individuals) of the equivalent circuit parameters R and C is referred to as a current generation.

«Algorithm A52»

The fitness (difference between i' and i) of the current generation group of individuals (the sets 521 to 525) is calculated using a predetermined evaluation function (for example, comparison of i' with i using Expression 2).

Sets having a high fitness (the difference between i' and i is relatively small), for example, sets (individuals) 521S and 522S survive.

Sets 523D, 524D, and 525D which are sets having a low fitness (the difference between i' and i is relatively large) are removed.

«Algorithm A53»

Next generation individuals (sets) which are new individuals (sets) are generated from the surviving sets 521S and 522S using the following method (operation) (offspring generation).

Any one of the following operations (<1>, <2>, and <3>) is performed at a predetermined probability, and the results are preserved as next generation individuals (sets 521S, 522S, 533N, 534N, and 535N).

<1> Two individuals (the sets 521S and 522S) are selected and crossed. That is, a portion of the equivalent circuit parameters R and C, that is, either R or C is replaced. A new set (individual) of the equivalent circuit parameters R and C is assumed to be a next generation individual (any one of the sets 533N, 534N, and 535N).

<2> One individual (the set 521S or 522S) is selected and mutated. That is, a portion of the equivalent circuit parameters R and C is changed. A new set of the equivalent circuit parameters R and C is assumed to be a next generation individual (any one of the sets 533N, 534N, and 535N).

<3> One individual (the set 521S or 522S) is selected and copied. That is, the number of the same sets (individuals) of the equivalent circuit parameters R and C is increased. A new set of the equivalent circuit parameters R and C is assumed to be a next generation individual (any one of the sets 533N, 534N, and 535N).

As such, the operations <1>, <2>, and <3> are probabilistically performed, and the operations are performed until the number of individuals (sets) becomes the original number N (five in FIG. 5).

«Algorithm A54»

After N next generations individuals (sets) (521S, 522S, 533N, 534N, and 535N) are obtained, the next generation individuals (sets) are moved to the current generation.

The N next generation individuals (sets) are taken as a current generation individual group, and the algorithms A51 to A53 are repeated.

After the algorithms are repeated until an error is within a predetermined error range or a predetermined number of times, a set of R and C which is an individual having the highest fitness (error of a calculated value from a measured value is smallest) is taken as a solution.

The genetic algorithm is equivalent to adjustment of R and C in Step S43 of FIG. 4, and is actually used in Steps S41 and S42 of FIG. 4.

<Change in Capacitance Over Time>

Hereinafter, change over time in the capacitance of a leakage current path will be described.

Figure 6:
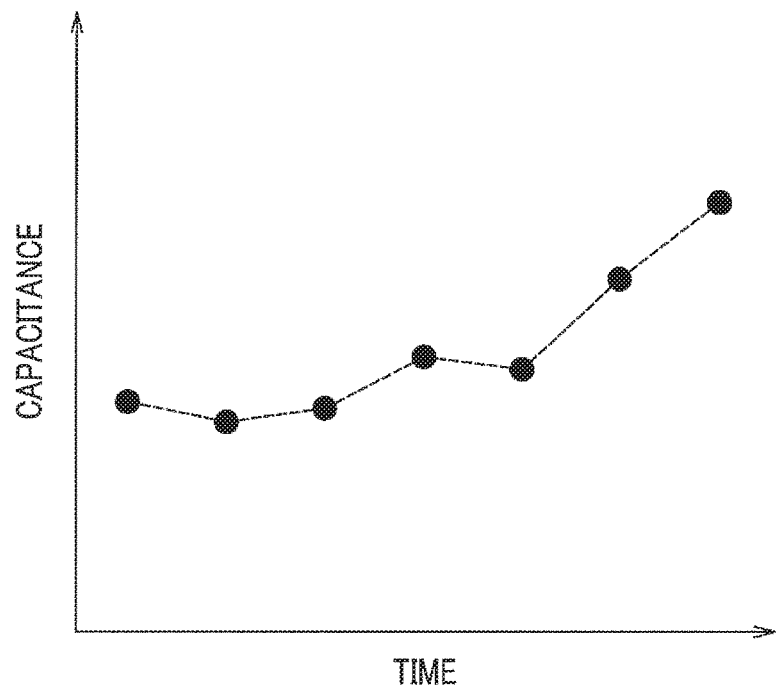
FIG. 6 is a schematic graph illustrating change over time in the capacitance of a leakage current path, which is obtained from a transiently changing motor, in the circuit configuration illustrated in FIGS. 1A and 1B.

FIG. 6 is a schematic graph illustrating change over in the capacitance of the leakage current path, which is obtained from the transiently changing motor, in the circuit configuration illustrated in FIGS. 1A and 1B.

In FIG. 6, a horizontal axis represents time, and a vertical axis represents the value of a capacitance, that is, a parameter of the leakage current path equivalent circuit which is calculated by the rotary machine diagnostic system.

In FIG. 6, time on the horizontal axis is a considerably long time in units of such as months or years in which the motor deteriorates naturally.

The capacitance tends to increase over time. Eventually, an insulation failure of the motor occurs.

As such, it is possible to ascertain change in the characteristics of the leakage current path via change in the capacitance. That is, it is possible to intentionally stop the motor before the motor fails completely and stops.

Information regarding change in the characteristics of the leakage current path is transmitted to related equipment, apparatuses, or a user (a person in charge or an operator), who manages the equipment or apparatuses, by the information transmission means. A display via a display unit or lamps, an alarm, a bell, a mail or the like can be used as the information transmission means.

The information regarding change in the characteristics of the leakage current path may be the value of the capacitance or the degree of abnormality obtained from the capacitance.

FIG. 6 illustrates an example in which the value of the capacitor C (indicated by reference 202 in FIG. 1B) increases due to deterioration of an insulation layer; however, an increase in the value of the capacitor C is not only a case. For example, an insulation layer may become thin due to evaporation or separation of resin of the insulation layer caused by heat, and thus, the capacitance may decrease.

Accordingly, as described above, it may be better to predict a failure based on change in the capacitance.

A process and means of determining abnormality via change in a capacitance or by comparing the value of a capacitance with a reference value are an example of abnormality determination means.

<Information Display Means>

Figure 7:
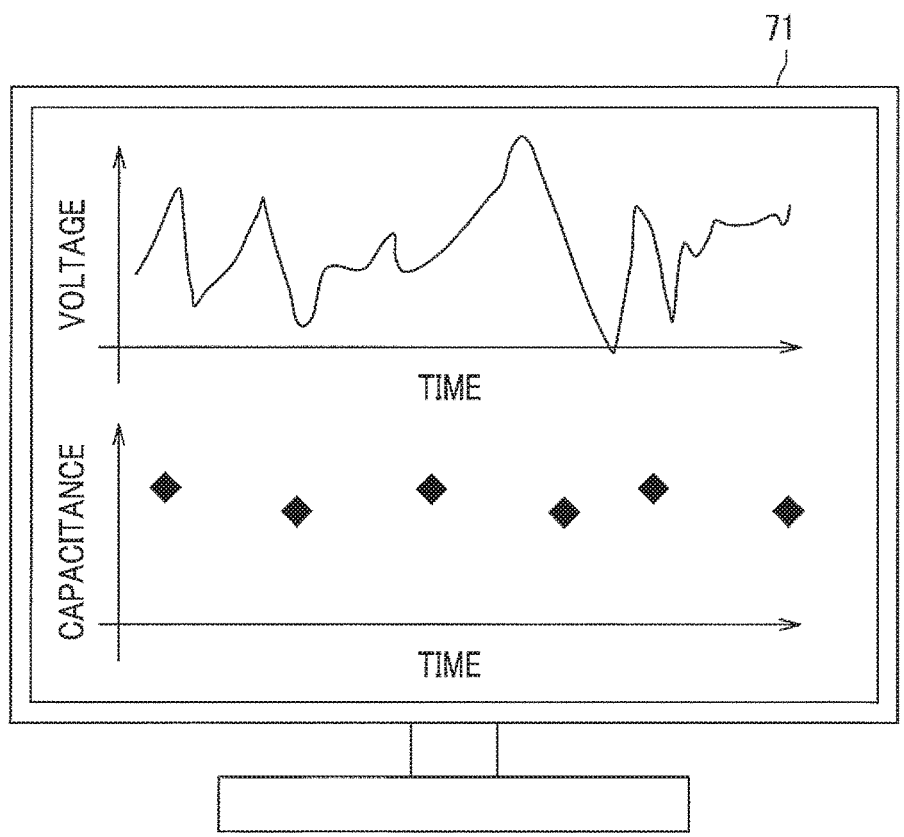
FIG. 7 is a view illustrating an example of information display means that displays change over time in a voltage applied to a motor and the capacitance of a leakage current path.

FIG. 7 is a view illustrating an example of information display means (display) 71 that displays change over time in a voltage applied to the motor and the capacitance of a leakage current path. The information display means 71 is one of the information transmission means.

In FIG. 7, the information display means 71 which is a display illustrates change over time in voltage and change over time in the value of a capacitance on a screen.

As such, a relationship of a voltage waveform and the capacitance to time is displayed and can be transmitted to a user (a person in charge or an operator) who manages a relationship between an operation pattern and the capacitance.

Although not illustrated in FIG. 7, a leakage current waveform may be displayed instead of a voltage waveform, or both of a leakage current waveform and a voltage waveform may be displayed.

FIG. 7 illustrates the capacitance; however, the degree of abnormality obtained from the capacitance may be displayed. In a case where the value of a capacitance exceeds a threshold value range which is set in advance, information indicating that the threshold value range has been exceeded may be displayed.

<Comparison of Capacitance and Resistance Extraction Accuracy Between Transient Response Analysis and Fast Fourier Transform>

Hereinafter, the accuracy in extracting the capacitance and resistance via the transient response analysis technique in the first embodiment of the present invention is compared with that via the fast Fourier transform analysis technique in the related art. The comparison is made based on the concept that the values of a resistor R1 and a capacitor C1 can be restored from a voltage simulating transient changes, and a current flowing through a parallel circuit of the resistor R1 and the capacitor C1 when the voltage is applied to the parallel circuit.

The values of the resistor R1 and the capacitor C1 are obtained by applying predetermined values to the values of the resistor R and the capacitor C in the parallel circuit model of R and C illustrated in FIG. 3.

Figure 8A:
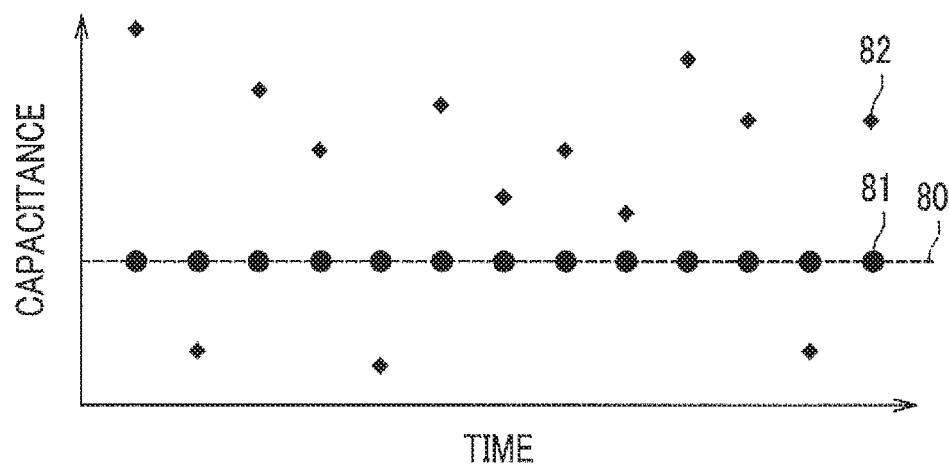
Figure 8B:
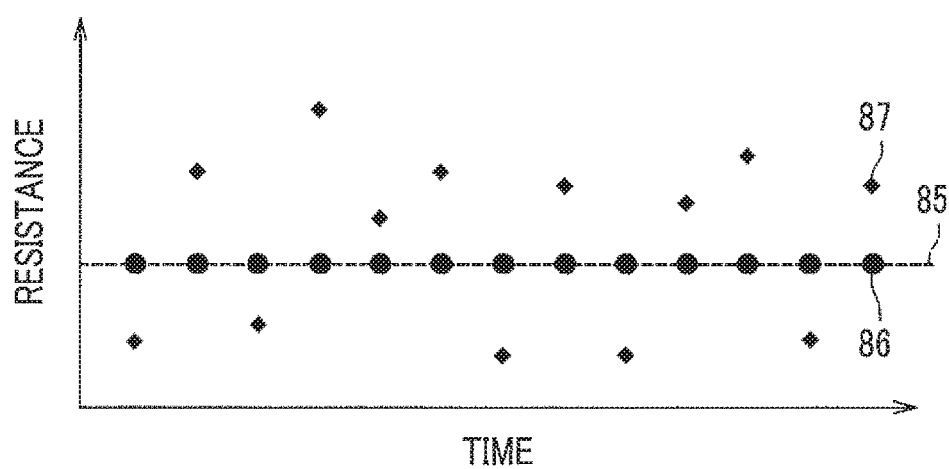

FIGS. 8A and 8B are graphs illustrating examples comparing the accuracy in extracting the capacitance and the resistance of a leakage current path based on the transient response analysis technique in the first embodiment of the present invention with that based on the fast Fourier transform analysis technique in the related art, in which FIG. 8A illustrates change over time in a capacitance, and FIG. 8B illustrates change over time in resistance.

In FIG. 8A, a horizontal axis represents time, and a vertical axis represents a capacitance. Each of multiple black round points ● (81) represents the value of a capacitance obtained via transient response analysis in the present invention, and each of multiple black rhombus-shaped points ◆ (82) represents the value of a capacitance obtained via fast Fourier transform analysis in the related art. A dotted line illustrated by reference sign 80 illustrates the set value of the capacitor C1.

In FIG. 8B, a horizontal axis represents time, and a vertical axis represents resistance. Each of multiple black round points ● (86) represents the value of resistance obtained via transient response analysis in the present invention, and each of multiple black rhombus-shaped points ◆ (87) represents the value of resistance obtained via fast Fourier transform analysis in the related art. A dotted line illustrated by reference sign 85 illustrates the set value of the resistor R1.

In transient response analysis according to the first embodiment of the present invention, a voltage waveform determined arbitrarily, and a current waveform obtained via simulation are cut into sections having a predetermined time width at predetermined time intervals. Transient response analysis is executed, and the capacitance and the resistance are extracted from results of calculation.

The fast Fourier transform analysis technique in the related art is executed, and the capacitance and the resistance are extracted.

In FIG. 8A, both the capacitance obtained via transient response analysis in the first embodiment of the present invention and the capacitance obtained via the fast Fourier transform analysis technique in the related art are displayed and compared with each other.

In FIG. 8B, both the resistance obtained via transient response analysis in the first embodiment of the present invention and the resistance obtained via the fast Fourier transform analysis technique in the related art are displayed and compared with each other.

The value of a capacitance obtained via transient response analysis is a value obtained based on the phase difference and amplitude of current and voltage components having a frequency of 50 Hz.

As described above, reference signs (dotted line) 80 and 85 in FIGS. 8A and 8B represent the set values of the capacitor C1 and the resistor R1, and the capacitance and resistance extraction accuracy improves as the values of C and R extracted via calculation becomes closer to these values.

When the value represented by reference sign (dotted line) 80, the capacitance 82 obtained via fast Fourier transform analysis, and the capacitance 81 obtained via transient response analysis are compared with each other, it is ascertained that the capacitance extraction accuracy of transient response analysis in the first embodiment of the present invention is higher than that of the fast Fourier transform analysis technique in the related art.

When the value represented by reference sign (dotted line) 85, the resistance 87 obtained via fast Fourier transform analysis, and the resistance 86 obtained via transient response analysis are compared with each other, it is ascertained that the resistance extraction accuracy of transient response analysis in the first embodiment of the present invention is higher than that of the fast Fourier transform analysis technique in the related art.

Even if a voltage applied to the motor (rotary machine) 13 (FIGS. 1A and 1B) changes transiently, the rotary machine diagnostic system in the first embodiment of the present invention is capable of accurately calculating a parameter of a leakage current path equivalent circuit. As a result, it is possible to ascertain a deteriorated state of the motor 13 without stopping the motor 13, and to forestall an unexpected failure.

«Second Embodiment»

A rotary machine diagnostic system in a second embodiment of the present invention will be described.

The point of difference between the second embodiment and the first embodiment is a capacitance extraction method.

In the first embodiment, the capacitance extraction method using Expression 2 is based on a criterion of whether the relationship of i'=i is satisfied; however, comparison may be made based on another criterion of whether a voltage obtained via analysis coincides with a measured voltage. In the second embodiment, a parameter extraction method is performed according to the other criterion.

In a case where i is known in the RC parallel circuit illustrated in FIG. 3, a voltage v' is represented by Expression 3, and the value of C which satisfies the condition of v'=v may be found from v' obtained using Expression 3 and a measured voltage v. $v(t_0)$ is the value of v at time $t_0$.

$$v'(t) = v(t_0)e^{-(t-t_0)/CR} + e^{-t/CR}\int_{t_0}^{t} \frac{i(\zeta)e^{\zeta/CR}}{C} d\zeta \qquad \text{(Expression 3)}$$

Expression 3 is represented in an integral form, and thus, is a mathematical formula in which an initial condition ($t=t_0$) is taken into consideration.

A calculation technique (the second embodiment) using the voltage v' is less susceptible to noise during measurement (the error is small).

«Third Embodiment»

A rotary machine diagnostic system in a third embodiment of the present invention will be described.

<Method of Connecting Current Sensor>

The point of difference between the third embodiment and the first and second embodiments is a leakage current measurement method.

In the first and second embodiments, the current sensor 14 in FIG. 1A is disposed to surround the power supply lines 12a, 12b, and 12c; however, insofar as an increase in leakage current can be measured, a method of connecting a current sensor is not limited to a specific method.

In a method of connecting a current sensor, a current difference between a coil winding start point and a coil winding end point of each of the power supply lines 12a, 12b, and 12c may be measured. Also, in a method in which a current flowing through each of the power supply lines 12a, 12b, and 12c is measured by a current sensor, and an increased leakage current for a phase is obtained from the sum of the currents, it is possible to obtain the effects of the present invention.

«Fourth Embodiment»

A rotary machine diagnostic system in a fourth embodiment of the present invention will be described.

<Method of Deriving Value of Capacitor C>

The point of difference between the fourth embodiment and the first to third embodiments is a method of deriving the value of the capacitor C.

In the first to third embodiments, the value of the capacitor C when a predetermined determination indicator is less than the predetermined threshold value is extracted. However, the present invention is not limited to that method.

There may be a method in which predetermined multiple combinations of R and C are calculated using Expression 2, and the value of C is selected from a combination having the smallest error. Also, in this method, it is possible to obtain the effects of the present invention.

In this method, it is possible to reduce the length of a calculation time.

«Fifth Embodiment»

A rotary machine diagnostic system in a fifth embodiment of the present invention will be described.

<Diagnostic Method Using Both Resistor R and Capacitor C>

In the first to fourth embodiments, the value of the capacitor C is extracted, and there may be a diagnostic method that also uses the value of the resistor R obtained in this process.

A value obtained by dividing the value of R by the value of C, or a value obtained by dividing the value of C by the value of R may be used.

Also, in a case where both of R and C are used for diagnosis, it is possible to detect a change in physical properties of a leakage current path caused by deterioration of insulation, and to obtain the effects of the present invention.

There is a case in which deterioration of an insulation layer or the like is not detected based on change in the value of the capacitor C. In this case, as described above, deterioration of an insulation layer may be detected based on change in the value of the resistor R. In a case where there is change in the value of the resistor R, the method of using a value obtained by dividing the value of R by the value of C, or a value obtained by dividing the value of C by the value of R, or the method of using both for diagnosis is effective.

«Sixth Embodiment»

A rotary machine diagnostic system in a sixth embodiment of the present invention will be described.

<Embodiment in which Both Transient Response Analysis and Fast Fourier Transform Analysis are Used>

In the sixth embodiment, both transient response analysis and fast Fourier transform analysis are used.

Fast Fourier transform analysis is an analysis technique by which a normal response to simple sinusoidal inputs is obtained in a case where the inputs are periodic. Typically, not only one frequency is analyzed but also a predetermined frequency range is analyzed at predetermined frequency intervals, and overall response characteristics are ascertained.

As described above, fast Fourier transform analysis is a method which is performed on the assumption that inputs are periodic. For this reason, in a case where a change in load of the motor (indicated by reference 13 in FIGS. 1A and 1B) is large, a change in current increases, and the Fourier transform required in the process of fast Fourier transform analysis cannot be performed. For example, in a case where a change in load current reaches approximately 10% to approximately 25%, a calculation error increases, and fast Fourier transform analysis cannot be practically used.

In contrast, as described above, transient response analysis is a technique suitable for when a motion changing over time is analyzed, and is an analysis for determining what response is made to inputs changing over time. For this reason, it is possible to use the transient response analysis technique in a case where inputs are not periodic and are sporadic.

Accordingly, even if a change in load current increases, and exceeds approximately 10% to approximately 25%, calculation can be performed. In principle, in a case where a narrow time width is set in transient response analysis, calculation can be theoretically performed without an upper limit to a change in load current.

In contrast, typically, a calculation load is higher and the calculation takes a longer time when a parameter of an equivalent circuit is extracted via transient response analysis in contrast to when the parameter of the equivalent circuit is extracted via fast Fourier transform analysis.

For this reason, it is possible to reduce a calculation load when extracting a parameter of an equivalent circuit by including both of a rotary machine diagnostic system using transient response analysis and a rotary machine diagnostic system using fast Fourier transform analysis, and changing a capacitance extraction technique according to the operation pattern of a motor.

Accordingly, it is preferable that fast Fourier transform analysis is selected in a case where a change in load current is small, and transient response analysis is selected in a case where a change in load current is large.

The capacitance extraction technique via transient response analysis or the capacitance extraction technique via fast Fourier transform analysis may be automatically selected according to the operation pattern of the motor, or setting means through which a user (a person in charge or an operator) can change the capacitance extraction technique may be provided.

In the sixth embodiment, it is effective and practical for the data processing apparatus 15 to include means for executing first to third modes which will be described below.

«First Mode»

For example, in a case where a change over a predetermined time width in the load current of the rotary machine 13 is greater than or equal to a predetermined threshold value, the data processing apparatus 15 executes data processing (calculation) in the first mode (first mode execution means) in which a determination parameter (for example, a capacitance parameter or an equivalent circuit parameter) corresponding to a leak current is calculated via transient response analysis. Any value in a range of 10% to 25%, preferably, any value in a range of 15% to 20% is adopted as the predetermined threshold value for a change in load current.

«Second Mode»

In a case where a change over a predetermined time width in the load current of the rotary machine 13 (FIGS. 1A and 1B) is less than the predetermined threshold value which is described above, the data processing apparatus 15 (FIGS. 1A and 1B) executes data processing (calculation) in the second mode (second mode execution means) in which a determination parameter corresponding to a leak current is calculated via fast Fourier transform analysis.

«Third Mode»

The data processing apparatus 15 may have an option for executing data processing (calculation) in the third mode (third mode execution means) in which a determination parameter corresponding to a leak current is calculated over a time period shorter than the predetermined time width via transient response analysis, in a case where a change over a predetermined time width in the load current of the rotary machine 13 exceeds a second threshold value (any value in a range of 50% to 60%). In the third mode, in a case where the amount of change in load of the rotary machine 13 is considerably large, multiple threshold values corresponding to the magnitude of the amount of change in load may be provided, and transient response analysis may be performed in a state where the predetermined time width is changed in a stepwise manner corresponding to the threshold values.

«Selection of Mode»

A change in the load current of the rotary machine 13 may be detected, and a mode may be automatically switched between the first mode, the second mode, and the third mode, or a user (a person in charge or an operator) may select a mode therefrom.

The first mode, the second mode, and the third mode have been described; however, only the first mode and the second mode may be provided.

The range of a change in load current, which becomes a reference for switching among the first mode, the second mode, and the third mode, or for switching between the first mode and the second mode, is not limited to the aforementioned numerical values. The range of a change in load current may be changed according to the type of rotary machine, or conditions of an environment in which the rotary machine is connected in the system.

The data processing apparatus 15 includes mode selection means for selecting the first mode, the second mode, or the third mode.

<Handling of Rotary Machine Diagnostic System>

In the sixth embodiment, in a case where a user (a person in charge or an operator) manually switches the mode, physical switching means (extraction method selection means) such as a toggle switch may be used to switch between the determination parameter extraction technique and the capacitance extraction technique. The diagnostic system may be provided with switching means (extraction method selection means) such as a pull-down menu displayed on a portion of the setting screen of the diagnostic system, or a radio button displayed on a portion of the setting screen of the diagnostic system.

A display item is not limited to a specific item, and a display item may be selected such that the analysis technique is switched between fast Fourier transform analysis and transient response analysis via the display item. Alternatively, a display item may be selected such that the mode is switched among the first mode, the second mode, and the third mode via the display item.

Figure 9:
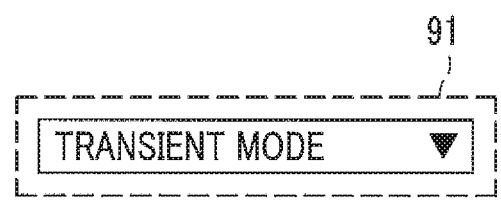
FIG. 9 is a view illustrating an example pull-down menu that is displayed on a portion of a setting screen of the rotary machine diagnostic system in the present invention.

FIG. 9 is a view illustrating an example pull-down menu that is displayed on a portion of the setting screen of the rotary machine diagnostic system. In FIG. 9, the portion 91 of the setting screen of the rotary machine diagnostic system displays a pull-down menu for selecting a transient mode (mode of transient response analysis).

Figure 10:
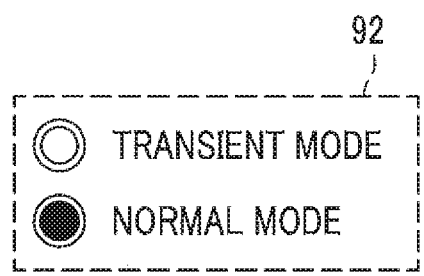
FIG. 10 is a view illustrating an example radio button that is displayed on a portion of the setting screen of the rotary machine diagnostic system in the present invention.

FIG. 10 is a view illustrating an example radio button that is displayed on a portion of the setting screen of the rotary machine diagnostic system. In FIG. 10, the portion 92 of the setting screen of the rotary machine diagnostic system displays a radio button for selecting a transient mode (mode of transient response analysis) or a normal mode (mode of fast Fourier transform analysis).

The portion (pull-down menu) 91 of the setting screen of the rotary machine diagnostic system, and the portion (radio button) 92 of the setting screen of the rotary machine diagnostic system illustrated in FIG. 9 may be displayed on a screen of the information display means (display) 71 illustrated in FIG. 7.

«Other Embodiments»

The present invention has been specifically described based on the embodiments; however, the present invention is not limited to the embodiments, and changes can be made to the embodiments in various forms insofar as the changes do not depart from the concept of the present invention.

Hereinafter, other embodiments and modification examples will be described.

«Other Examples of Rotary Machine»

In the first embodiment, a three-phase motor (electric motor) has been described as an example of a rotary machine; however, the present invention is not limited to a three-phase motor.

For example, in a case where a rotary machine is a generator, only a flow direction of the power may be reversed, but analysis can be executed in the same manner with the same techniques.

Analysis can be executed in the same manner with the same techniques, no matter whether the type of motor (electric motor) or generator is a synchronous type or an induction type.

In the first embodiment, a Y-connected three-phase motor has been illustrated and described; however, the connection is not limited to a Y-connection. A three-phase motor (electric motor) or generator may be configured such that coils are delta connected to each other.

In the first embodiment, a three-phase motor having three power supply lines is illustrated; however, the number of phases may be different from that in the first embodiment.

«Change in Capacitance»

In the first embodiment, the case of an increase in a capacitance has been described; however, actually, the capacitance may decrease. That is, either an increase or a decrease in a capacitance may be extracted as a deterioration indicator, which is not specifically fixed. In either case, it is possible to ascertain change in characteristics of a leakage current path based on change in the capacitance.

A diagnostic technique using capacitance is not limited to the method described in the first embodiment.

For example, it is possible to adopt a method in which information is transmitted in a case where a change in the capacitance relative to an initial value exceeds a predetermined threshold value range, or a method in which information is transmitted in a case where a change obtained via multi-variable analysis of information regarding humidity, temperature, and the like other than capacitance exceeds a predetermined threshold value range.

«Equivalent Circuit Model»

In the first and second embodiments, a parallel circuit of the resistor R and the capacitor C modeling a leakage current path has been described as a simple example model; however, other equivalent circuit models may be used. For example, an equivalent circuit model may include an inductor L. Not only a parallel circuit but also a circuit in which R, C, and L are connected in series and in parallel with each other in various forms may be used.

In a case where an equivalent circuit model is changed, the form of an equation to be solved changes, and calculation is performed using the equation.

«Form of Differential Equation»

In the first and second embodiments, Expressions 2 and 3 can be used based on the criteria of whether the relationship of i'=i or the relationship of v'=v is satisfied. However, the equation is not limited to Expressions 2 and 3. It is possible to obtain the same effects as those in the present invention also if a value obtained via integration of both sides of the expression, a calculation method of a differentiated mathematical formula, or a calculated value is used.

«Current Data and Voltage Data Used in Extraction of Equivalent Circuit Parameter»

In the first embodiment, the sum of a zero-phase current acquired by the current sensor 14 (FIG. 1A) and a three-phase voltage acquired from phase (three phase) voltages acquired by the voltage sensors 16a, 16b, and 16c is used to derive a parameter of a leakage current path equivalent circuit.

However, current data and voltage data used to derive a parameter of a leakage current path equivalent circuit are not limited to those in the aforementioned case.

For example, a combination of a difference (current data) between predetermined phase (any one of the U phase, the V phase, and the W phase) currents flowing through a winding start point and a winding end point of the rotary machine 13 (FIGS. 1A and 1B) and a predetermined phase voltage (voltage data) may be used.

A combination of a difference (current data) between predetermined phase (any one of the U phase, the V phase, and the W phase) currents flowing through a winding start point and a winding end point of the rotary machine 13, a predetermined phase voltage (voltage data), and the voltage of the neutral point (indicated by reference 333 in FIG. 1B) may be used.

In a case where the difference (current data) between currents flowing through the winding start point and the winding end point for the predetermined phase (any one of the U phase, the V phase, and the W phase) is used, in FIG. 1A, current sensors (not illustrated) are respectively provided on the three-phase power supply lines 12a, 12b, and 12c.

DESCRIPTION OF REFERENCE SIGNS

11: Power supply
12a, 12b, 12c: Power supply line
13: Motor (Electric motor)
14: Current sensor (Current measurement means (unit))
15: Data processing apparatus (Data processing means (unit))
16a, 16b, 16c: Voltage sensor (Voltage measurement means (unit))
131, 132, 133: Stator coil
333: Neutral point
71: Information display apparatus (Information display means (unit), Information transmission means (unit))

What is claimed is:

1. A rotary machine system comprising:
a power supply that supplies three-phase alternating current power;
an electric motor that receives the three-phase alternating current power from the power supply;
power supply lines interconnecting the power supply and the electric motor;
a diagnostic system including a current sensor that measures current of the power supply lines and outputs current measurement data, voltage sensors that detect respective electric potentials of the power supply lines and output voltage measurement data, and a data processing apparatus that receives the current measurement data and the voltage measurement data and performs transient response analysis on a predetermined equivalent circuit model, which is equivalent to a leakage current path of the electric motor, using the current measurement data and the voltage measurement data that are respectively measured at predetermined time intervals having a predetermined time width by the current sensor and the voltage sensors, and extracts parameters of the leakage current path equivalent circuit model.

2. The rotary machine system according to claim 1, wherein at least one of the parameters of the leakage current path equivalent circuit model is a capacitance.

3. The rotary machine system according to claim 1, wherein the predetermined equivalent circuit model is a parallel circuit of a capacitor and a resistor.

4. The rotary machine system according to claim 1, wherein an algorithm of the function of extracting the parameters of the leakage current path equivalent circuit model via transient response analysis is a genetic algorithm.

5. The rotary machine system according to claim 1, wherein the current data and the voltage data used to extract the parameters of the leakage current path equivalent circuit model are any of the sum of a zero-phase current and three phase voltages of the electric motor, a combination of a difference between predetermined phase currents flowing through a winding start point and a winding end point of the electric motor and a predetermined phase voltage, and a combination of a difference between predetermined phase currents flowing through a winding start point and a winding end point of the electric motor, a predetermined phase voltage, and a voltage of a neutral point.

6. The rotary machine system according to claim 1, further comprising information transmission means for transmitting information, which indicates that a predetermined threshold value range is exceeded, in a case where a capacitance which is a parameter of the leakage current path equivalent circuit model exceeds the predetermined threshold value range.

7. The rotary machine system according to claim 1, further comprising:
    means for extracting parameters of the leakage current path equivalent circuit model via fast Fourier transform analysis.

8. The rotary machine system according to claim 7, further comprising:
    extraction method selection means for selecting means for extracting parameters of the leakage current path equivalent circuit model via transient response analysis or via fast Fourier transform analysis.

9. The rotary machine system according to claim 1, wherein the data processing apparatus calculates a determination parameter corresponding to a leakage current from multiple time series current data items having the predetermined time width measured by the current sensor and multiple time series phase voltage data items at times corresponding to the time series current data items, and wherein the data processing apparatus includes first mode execution means for calculating the determination parameter in a case where a change over the predetermined time width in the current of the power supply lines is greater than or equal to a predetermined threshold value, and second mode execution means for calculating the determination parameter in a case where a change over the predetermined time width in the current of the power supply lines is less than the predetermined threshold value.

10. The rotary machine system according to claim 9, wherein the predetermined threshold value is set to any value in a range of 10% to 25% change, over the predetermined time width, in the current of the power supply lines.

11. The rotary machine system according to claim 9, wherein the first mode execution means calculates the determination parameter via transient response analysis, and the second mode execution means calculates the determination parameter via fast Fourier transform analysis.

12. The rotary machine system according to claim 9, further comprising:
    information display means for displaying either a leakage current or a phase voltage, or both the leakage current or the phase voltage and a time history of the determination parameter.

* * * * *